(12) United States Patent
Brezina et al.

(10) Patent No.: US 6,278,615 B1
(45) Date of Patent: Aug. 21, 2001

(54) HEATSINK GROUNDING SPRING AND SHIELD APPARATUS

(75) Inventors: Johnny Roy Brezina; John Saunders Corbin, Jr.; Daniel Edward Massey, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,452

(22) Filed: Jun. 30, 1999

(51) Int. Cl.[7] ....................................... H05K 9/00
(52) U.S. Cl. .................. 361/799; 361/709; 361/753; 174/51; 24/563
(58) Field of Search ..................... 361/688, 703, 361/704, 709, 717, 799, 800, 801, 809, 816, 818; 174/16.3, 35 R, 51; 24/563

(56) References Cited

U.S. PATENT DOCUMENTS

| | | | | |
|---|---|---|---|---|
| 5,053,924 | * | 10/1991 | Kurang | 361/818 |
| 5,357,404 | * | 10/1994 | Bright et al. | 361/818 |
| 5,373,101 | * | 12/1994 | Barabolak | 174/35 R |
| 5,566,052 | * | 10/1996 | Hughes | 361/704 |
| 5,653,600 | * | 8/1997 | Ollivier | 439/73 |

* cited by examiner

Primary Examiner—Jayprakash N. Gandhi
(74) Attorney, Agent, or Firm—Mark E. McBurney; Joseph P. Lally

(57) ABSTRACT

A heatsink grounding mechanism and an associated circuit card and computer system. The circuit card includes a printed circuit board to an integrated circuit module is attached. A heatsink is positioned in contact with or in close proximity to the integrated circuit module package. A heatsink grounding piece of the grounding mechanism is utilized to ground the heatsink. The grounding piece includes a substantially rectangular and conductive grounding piece ring that defines an aperture. The dimensions are suitable for receiving and circumventing the integrated circuit module. The grounding piece includes a set of semi-rigid conductive spring arms that extend away from the grounding piece ring. The spring arms are positioned and oriented such that termination points of the spring arms contact grounding pads on the printed circuit board when the grounding piece is compressed between the heatsink and the circuit board. The force of the spring arms against the circuit board maintains the grounding piece ring in electrical contact with the heat sink and the termination points of the spring arms in electrical contact with the grounding plates.

20 Claims, 3 Drawing Sheets

HEATSINK GROUNDING SPRING AND SHIELD APPARATUS

BACKGROUND

1. Field of the Present Invention

The present invention generally relates to the field of heatsinks for computer systems and more particularly to an effective method for effectively grounding a heatsink to minimize electro-magnetic interference.

2. History of Related Art

The use of heatsinks in connection with electronic components such as the integrated circuits modules of a computer system is well known. Comprised of a relatively massive piece of conductive metal, heatsinks placed in contact with the package of an integrated circuit module are effective in increasing the rate at which heat produced by the module is dissipated thereby beneficially enabling the module to maintain lower case and junction temperatures. Unfortunately, the conductive material that makes heatsinks effective as a heat dissipation mechanism can also render them effective as secondary antennas that can radiate electronic energy and cause elevated levels of electromagnetic interference. Because even slight amounts of interference can jeopardize the reliable operation of high speed, low power integrated circuits it is desirable to minimize the radiation effect of a heatsink. The level of interference can be effectively reduced by providing multiple ground paths between the heatsink and the ground plane of the circuit board to which the module is mounted. Therefore, it is advantageous to provide a duplicity of conductive paths between the heatsink and ground. Moreover, it is important to provide the ground paths without significantly increasing the cost of the product and without unnecessarily encumbering the heatsink. Heatsinks are frequently employed in the cooling of modules that are socketed to enable easy replacement of the module. Heatsink grounding solutions that involve permanent connections such as solder joints or the like are typically ill suited for use in such environments. Therefore it is desirable to provide an effective means of grounding integrated circuit module heatsinks in such a manner that the grounding mechanism is easily removed or replaced.

SUMMARY OF THE INVENTION

The problems identified above are in large part addressed by a heatsink grounding mechanism in which multiple conductive spring arms of a grounding piece are arranged to contact multiple grounding pads of a printed circuit board to which an integrated circuit module is attached. The spring arms force a ring portion of the grounding piece into contact with the bottom surface of a heatsink positioned in close proximity to an upper surface of the module package. A shielding piece may be used advantageously in conjunction with the grounding piece to prevent inadvertent movement or displacement of the springs arms.

Broadly speaking the invention contemplates a heatsink grounding mechanism and an associated circuit card and computer system. The circuit card includes a printed circuit board to which an integrated circuit module is attached. A heatsink is positioned in contact with or in close proximity to the integrated circuit module package. A heatsink grounding piece of the grounding mechanism is utilized to provide a conductive path between the heatsink and system ground. The grounding piece includes a substantially rectangular and conductive grounding piece ring that defines an aperture. The dimensions of the are suitable for receiving and circumventing the integrated circuit module. The grounding piece includes a set of semi-rigid conductive spring arms that extend away from the grounding piece ring. The spring arms are positioned and oriented such that termination points of the spring arms contact grounding pads on the printed circuit board when the grounding piece is compressed between the heatsink and the circuit board. The force of the spring arms against the circuit board maintains the grounding piece ring in electrical contact with the heat sink and the termination points of the spring arms in electrical contact with the grounding plates.

Preferably, the grounding piece is comprised of spring steel or stainless steel. In one embodiment, the grounding piece ring further defines a set of fastener holes suitable for receiving a corresponding set of fasteners used to attach the heatsink to the circuit board. The heatsink itself is preferably comprised of a conductive slab from which a plurality of conductive fins extend substantially perpendicularly such that the fins are substantially parallel to one another. In the preferred embodiment, the grounding piece fastener holes align with corresponding holes in the heatsink. The springs arms of the grounding piece may be integrally formed with the grounding piece ring by stamping portions of the grounding piece ring to form the spring arms. In addition to the grounding piece, the heatsink grounding mechanism may further include a shielding piece. In this embodiment, the shielding piece preferably includes a substantially rectangular shielding piece ring that defines a shielding piece aperture. Like the grounding piece aperture, the shielding piece aperture is preferably dimensioned for receiving the integrated circuit module. The shielding piece further includes a set of shielding piece walls that extend substantially perpendicularly from the shielding piece ring. The shielding piece walls are positioned to substantially enclose the spring arms of the grounding piece when the shielding piece ring is positioned between the grounding piece ring and the heatsink. The shielding piece is comprised of steel in the preferred embodiment. In one embodiment, the shielding piece ring further defines a set of aperture holes suitable for receiving the corresponding set of fasteners.

BRIEF DESCRIPTION OF THE DRAWINGS

Other objects and advantages of the invention will become apparent upon reading the following detailed description and upon reference to the accompanying drawings in which.

Figure 1:
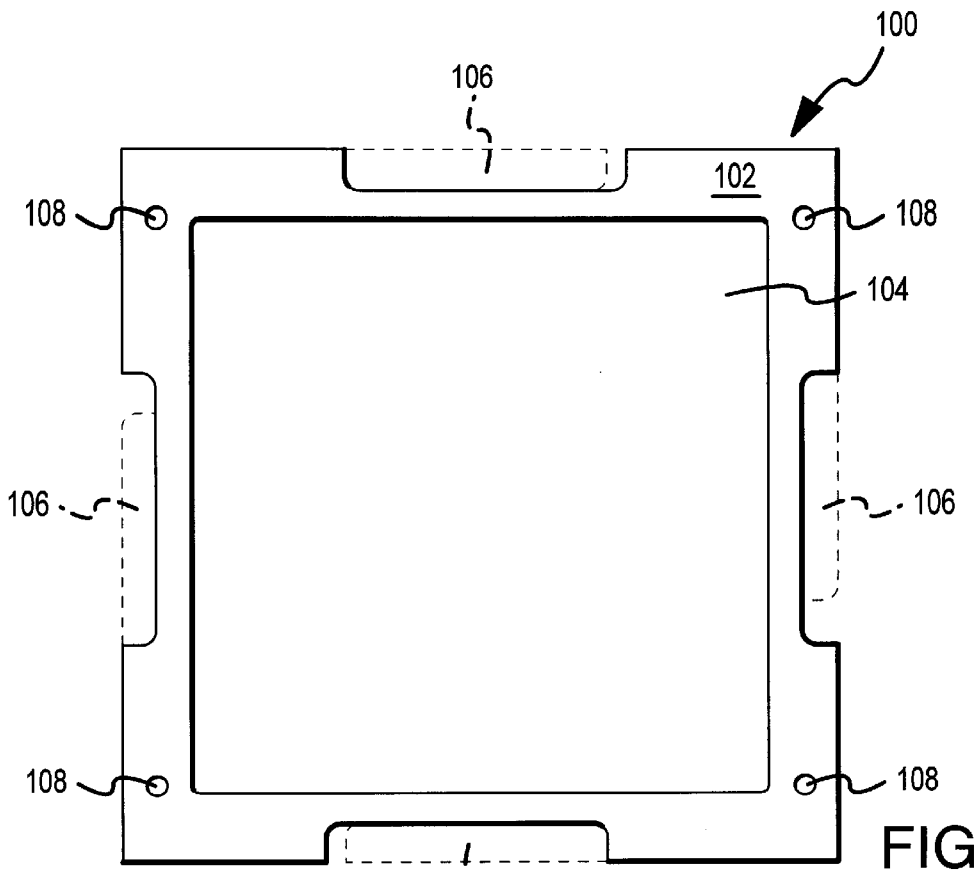
FIG. 1 is a top plan view of a grounding piece for use in grounding a heatsink.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Figure 2:
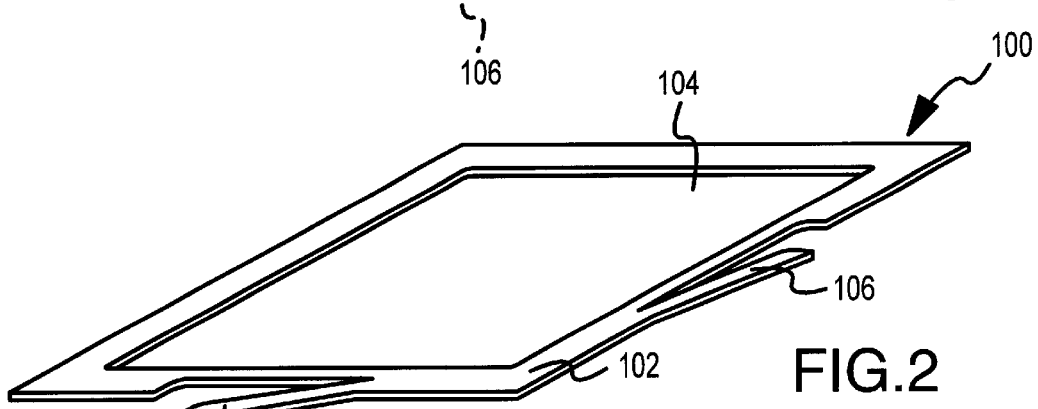
FIG. 2 is a perspective view of the grounding piece of FIG. 1.

Turning now to the drawings, FIGS. 1 and 2 present a top view and perspective view respectively of a heatsink grounding piece 100 according to one embodiment of the invention. Grounding piece 100 is comprised of a substantially rectangularly shaped and conductive ring 102 that defines an aperture 104. The dimensions of aperture 104 are suitable for receiving or circumscribing an integrated circuit module package. In one embodiment desirable for its durability, high conductivity, and relatively low cost, grounding piece ring 102 is comprised of spring steel or stainless steel. Grounding piece 100 further includes a set of conductive spring arms 106 that extend away from the plane defined by grounding piece ring 102. In an embodiment desirable for its ease of manufacture, the conductive spring arms 106 are stamped from sections of grounding piece ring 102 such that the spring arms 106 are integrally formed with grounding piece ring 102 at an angle in the approximate range of 30° to 60°. Spring arms 106 are designed to have a combination of rigidity and flexibility such that the springs arms will bend under an applied pressure to grounding piece ring 102 but will return to their original positions when the pressure is removed. In this manner, spring arms 106 provide a resistive force to grounding piece ring 102 when the ring is under pressure. While the embodiment of grounding piece ring 102 depicted in FIG. 1 indicates a single spring arm 106 corresponding to each side of grounding piece ring 102, the invention is intended to encompass various arrangements of spring arms 106 in grounding piece ring 102. Similarly, although spring arms 106 of the depicted embodiment are integrally formed with grounding piece ring 102, alternative embodiments may utilize discrete or separate spring arms that are attached to grounding piece ring 102 in an appropriate manner.

Figure 3:
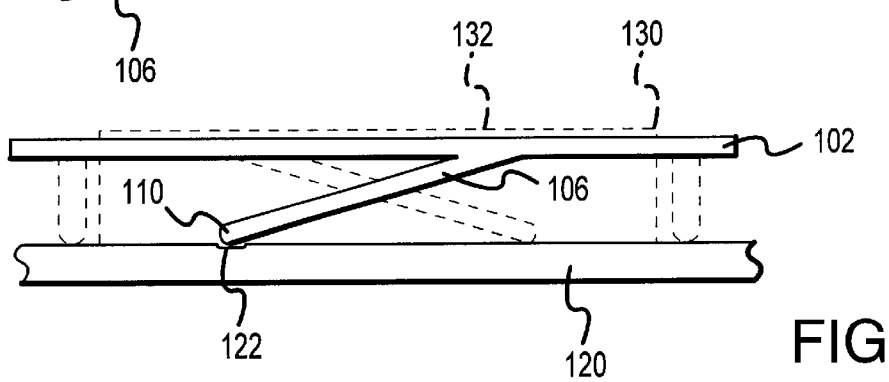
FIG. 3 is a side view of the grounding piece of FIG. 1 in connection with an integrated circuit module and a printed circuit board.

Turning to FIG. 3, a side view of grounding piece 100 is shown as used in connection with an integrated circuit module 130 and a printed circuit board 120. Integrated circuit module 130 may comprise a microprocessor or other device characterized by the high operating speeds and power consumption characteristic of modules that benefit from the use of a heatsink. Integrated circuit module 130 is suitably packaged in any of a variety of semiconductor package configurations including BGA, PLCC, and DIP configurations. Suitable packaging materials for integrated circuit module 130 include ceramic and plastic. Integrated circuit module 130 is typically soldered to printed circuit board 120. In an alternative arrangement, integrated circuit module 130 may be connected to printed circuit board 120 via a socket for easy replacement. In any event, grounding piece 100 is fitted over integrated circuit module 130 such that aperture 104 of grounding piece 100 circumscribes integrated circuit module 130. When a heatsink (not shown in FIG. 3) is placed in contact or in intimate proximity to upper surface 132 of integrated circuit module 130 and attached to printed circuit board 120, spring arms 106 are compressed. The force resulting from the compressed springs arms 106 forces grounding piece ring 102 into electrical contact with the heatsink. Spring arms 106 are positioned and oriented such that termination points 110 of each spring arm 106 are in contact with corresponding grounding pads 122 (only one of which is shown) in printed circuit board 120 when grounding piece 100 is compressed between the heatsink and circuit board 120. The grounding pads 122 of circuit board 120, as their name implies, are connected to the system ground plane that is externally supplied to printed circuit board 120 via a connector (not shown). The compressive force of springs arms 106 maintain termination points 110 of each spring arm in good electrical contact with corresponding grounding pads 122 of printed circuit board 120 while simultaneously maintaining grounding piece ring 102 in good electrical contact with the heatsink. If the heatsink is removed from the device, the compressed springs 106 return to their original position and grounding piece 100 may be removed or replaced by hand. In this manner, grounding piece 100 provides an effective means for maintaining a ground contact with a heatsink without requiring any additional heatsink hardware and without requiring any screws, solder joints, or other fastening mechanism to maintain grounding piece 100 in position.

Figure 4:
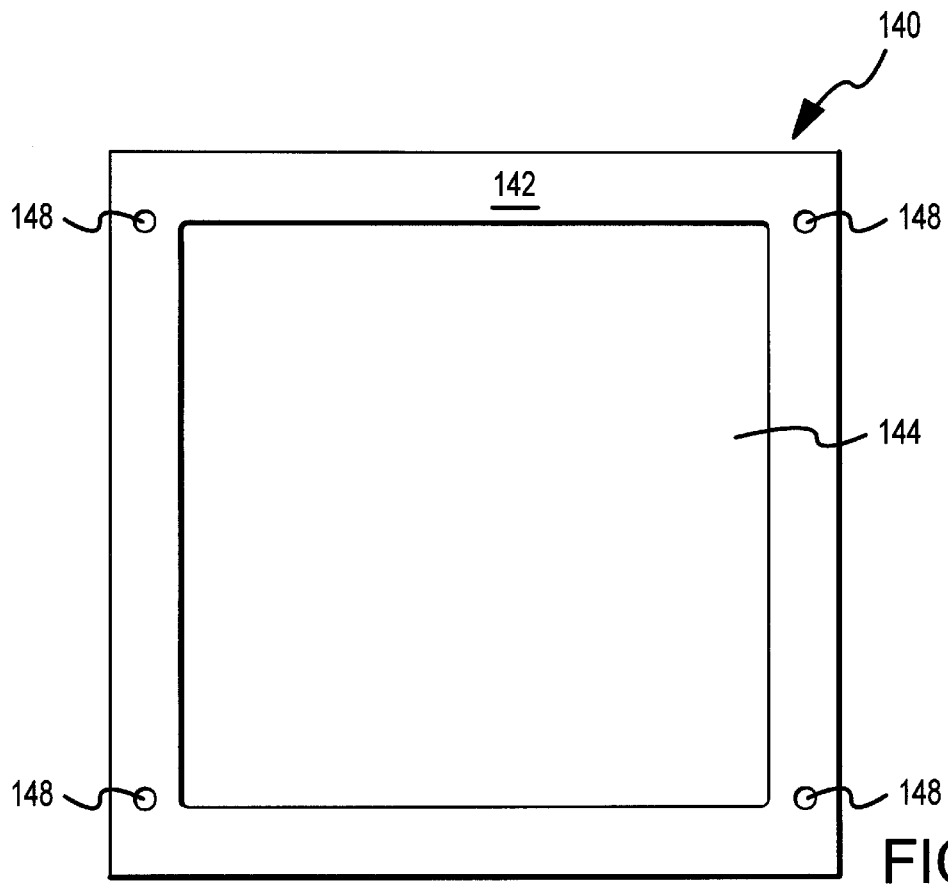
FIG. 4 is a top plan view of a shielding piece for use with the grounding piece of FIG. 1.
Figure 5:
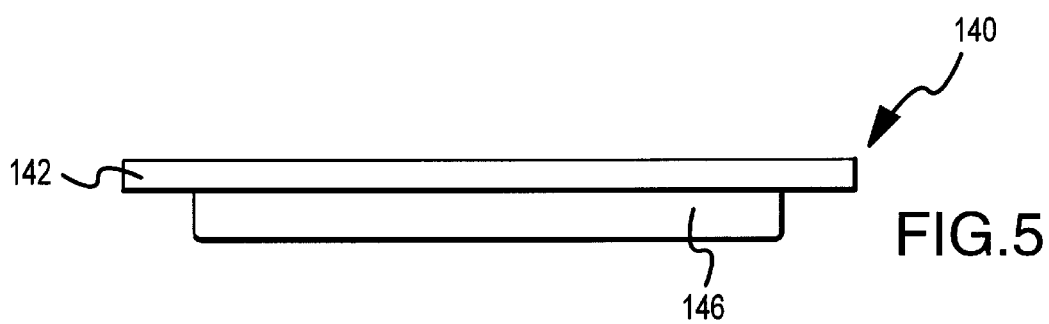
FIG. 5 is a side plan view of the shielding piece of FIG. 4.

Turning now to FIGS. 4 and 5, a shielding piece 140 is shown. Shielding piece 140 may be incorporated with the use of grounding piece 100 to provide protection to the spring arms 106 of grounding piece 100. Like grounding piece 100, shielding piece 140 is comprised of a substantially rectangular ring 142 the defines an aperture 144. Shielding piece ring 142 is preferably fabricated from a conductive material such as steel. In the preferred embodiment, shielding piece ring 142 is placed intermediate between grounding piece ring 102 and the heatsink. Referring to the side view of FIG. 5, it is seen that shielding piece 140 includes a set of shielding plates 146 (only one of which is visible in the figure) that extend substantially perpendicularly from shielding piece 142. In one embodiment, a shielding plate 146 is provided for each side of shielding piece ring 142. The shielding plates 146 are positioned and oriented to substantially enclose the spring arms 106 of grounding piece 100 when shielding piece 100 is positioned between grounding piece 100 and the heatsink with the spring arms 106 compressed in the manner described and depicted previously with respect to FIGS. 1, 2, and 3. The shielding plates 106 prevent accidental displacement of the spring arms 106 to provide additional assurance that the grounding piece 100 maintains a conductive path between the heatsink and ground (via an intermediate conductor in the form of shielding piece ring 142).

Figure 6:
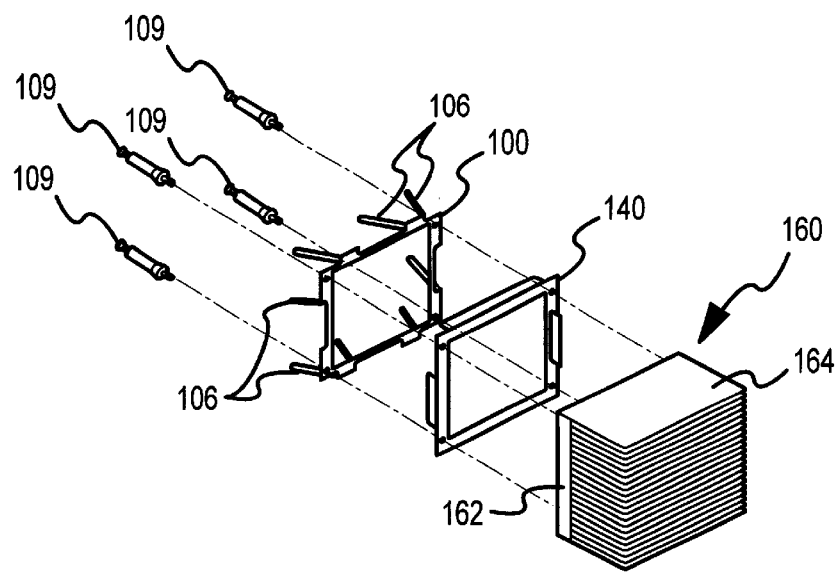
FIG. 6 is an exploded view of a heatsink and heatsink grounding mechanism including a grounding piece and a shielding piece.

Referring now to FIG. 6, an exploded view of grounding piece 100, shielding piece 140, and a heatsink 160 is depicted. In this view, a set of fasteners 109 are used to secure heatsink 160 to the printed circuit board (not shown in FIG. 6). In this embodiment, grounding piece 100 and shielding piece 140 may incorporate a corresponding set of fastener holes suitable for receiving the fasteners 109. Referring briefly back to FIG. 1 and FIG. 4, grounding piece 100 is shown as including a set of fastener holes 108 in grounding piece ring 102 while shielding piece 140 is shown as including a set of fastener holes 148 in shielding piece ring 142. In the preferred embodiment, fastener holes 108 of grounding piece 100 and fastener holes 148 of grounding piece 140 are aligned with corresponding fastener holes in heatsink 160. The incorporation of fastener holes 108 and 148 into grounding piece 100 and shielding piece 140 prevents lateral displacement of the corresponding piece and helps to further secure the pieces of the grounding mechanism in their finally assembled positions. Heatsink 160 is preferably comprised of a conductive block or slab 162 from which a set of conductive fins 164 extend. Typically, fins 164 extend from slab 162 in substantially parallel planes separated by a displacement sufficient to permit adequate air flow to dissipate the heat generated by the integrated circuit module with which the heatsink is in contact.

Figure 7:
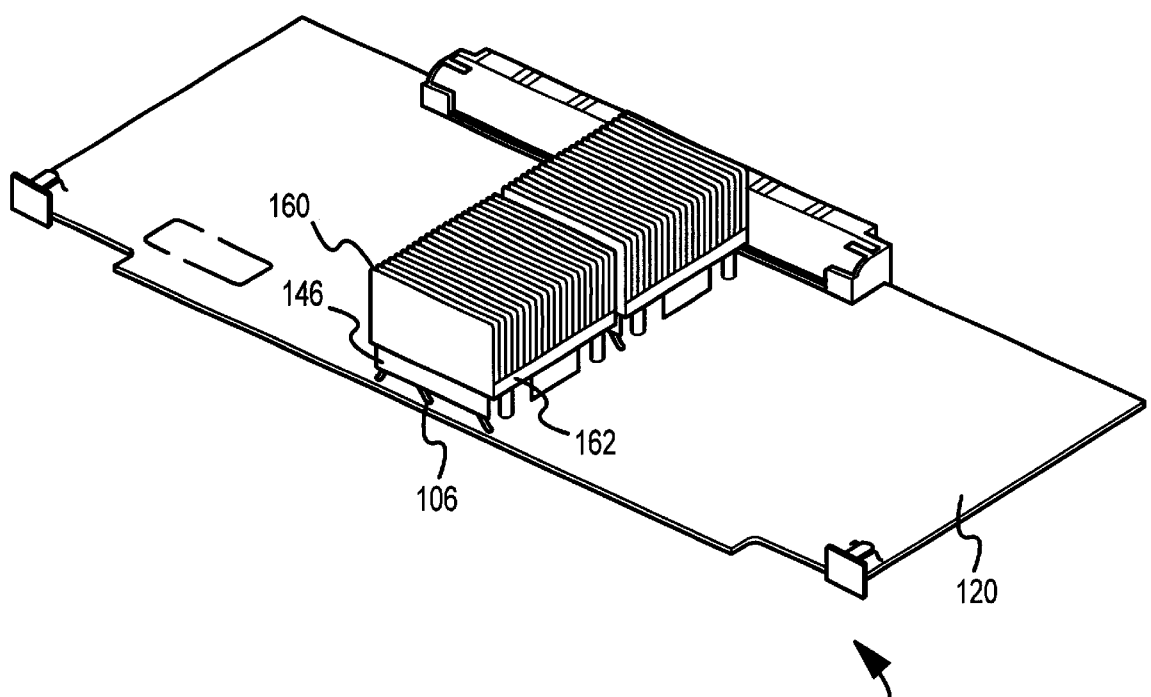
FIG. 7 is a perspective view of a circuit card including a heatsink and the heatsink grounding mechanism of FIG. 6.

Turning now to FIG. 7, a circuit card 170 including a heat dissipation and heatsink grounding mechanism according to one embodiment of the present invention is depicted. Circuit card 170 is comprised of the printed circuit board 120 introduced previously and the various components attached thereto. Printed circuit board 120 is preferably comprised of a laminated epoxy material upon which one or more layers of conductive interconnects are patterned according to well known printed circuit board manufacturing techniques. Printed circuit board 120 may have any of a wide variety of attached components and hardware include various integrated circuit modules, discrete components, connectors, fasteners and the like. As depicted in FIG. 7, a heatsink 160 is positioned in contact or in intimate proximity with an integrated circuit module (not visible in the drawing) that is soldered or otherwise attached to printed circuit board 120. Heatsink 160 may be in direct contact with an upper surface of the integrated circuit module or, in an alternative arrangement, a thin film of thermal paste or other thermal interface material may reside between the integrated circuit package and heatsink 160 to further promote efficient heat dissipation. Shielding piece 140 is in contact with the lower surface of the slab 162 of heatsink 160. Shielding plates 146 extend downward away from heatsink 140 and provide physical protection to the spring arms 106 (just visible in the figure) of shielding piece 100. Grounding piece 102 (not visible in the figure) is in contact with shielding piece 142 and is therefore in electrical contact with heatsink 160. Circuit card 100 may represent any of a wide variety of circuit cards used in computer systems and a variety of other electronic systems. Typically, heatsinks are associated with processors and other high performance integrated circuits that are capable of operating at high speeds and generating a large quantity of heat. Thus, circuit card 170 including the heatsink grounding mechanism described herein may comprise the motherboard of a computer system or it may comprise a processor card that plugs into the motherboard. Alternatively, circuit card 170 may comprise any of a variety of peripheral cards suitable for connecting to a standardized bus architecture such as the PCI, AGP, MCA, or ISA bus architectures. Suitable circuit cards fitting this classification include graphics adapters, high speed network controllers, hard disk controllers and the like.

Figure 8:
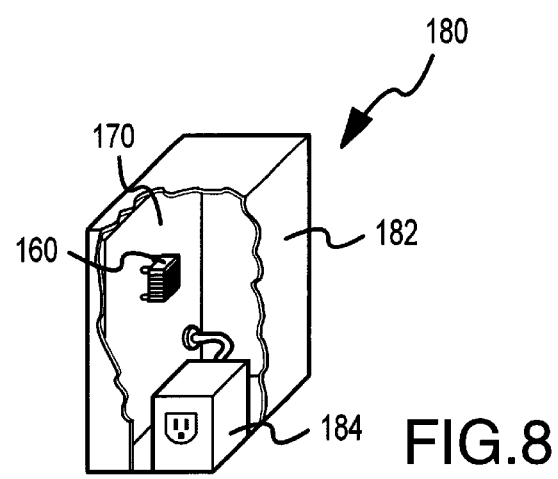
FIG. 8 is a cut-away view of a computer system including a circuit card utilizing a heatsink and heatsink grounding mechanism.

Turning now to FIG. 8, a computer system 180 is depicted including the heatsink grounding mechanism described herein. Computer system 180 includes a chassis 182 in which a power supply 184 is mounted. Power supply 184 is preferably adapted to receive standard AC or DC power to produce one or more dc power supply voltage levels. In embodiments of computer system 180 designed for low cost applications such as network computing machines, power supply 184 may produce just a single output voltage. In other embodiments, power supply 184 may produce multiple occurrences of a single output voltage to support multiple power states such as standby mode. In any event, power supply 184 provides power to circuit card 170 as described above with respect to FIG. 7. Circuit card 170 includes a heatsink 160 attached to an integrated circuit module (not visible in the figure), where the heatsink 160 is grounded according to the heatsink grounding mechanism described herein. Although the depicted embodiment of computer system 180 includes only a single circuit card 170 utilizing the heatsink grounding mechanism of the present invention, it will be readily appreciated that each circuit card of system 180 that includes a heatsink is a candidate for the heatsink ground mechanism described. By providing for a low cost and efficient mechanism for grounding heatsinks, the present invention beneficially reduces or eliminates electromagnetic interference frequently associated with heatsink devices thereby providing for a more reliable and high performance product.

It will be apparent to those skilled in the art having the benefit of this disclosure that the present invention contemplates an efficient and cost effective apparatus for reducing electro-magnetic interference in an integrated circuit in close proximity to a heatsink. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A circuit card comprising:
   a printed circuit board;
   an integrated circuit module attached to the printed circuit board;
   a heatsink in close proximity with a package of the module; and
   a grounding piece, wherein the grounding piece includes a substantially rectangular and conductive grounding piece ring defining an aperture dimensioned for receiving the integrated circuit module, and wherein the grounding piece includes a set of semi-rigid conductive spring arms extending away from the grounding piece ring at an angle of less than approximately 60° and positioned and oriented wherein termination points of the arms contact grounding pads on the printed circuit board, wherein the force of the spring arms against the printed circuit board maintains the grounding piece ring in electrical contact with the heat sink and the termination points of the spring arms in electrical contact with the grounding plates.

2. The circuit card of claim 1, wherein the grounding piece is comprised of steel.

3. The circuit card of claim 1, wherein the grounding piece ring further defines a set of fastener holes suitable for receiving a corresponding set of fasteners, wherein the grounding piece fastener holes align with corresponding holes in the heatsink.

4. The circuit card of claim 1, further comprising a shielding piece comprising a substantially rectangular shielding piece ring defining a shielding piece aperture dimensioned for receiving the integrated circuit module, wherein the shielding piece further includes a set of shielding piece walls extending substantially perpendicularly from the shielding piece ring, wherein the walls are positioned to substantially enclose the spring arms of the grounding piece when the shielding piece ring is positioned intermediate between the grounding piece ring and the heatsink.

5. The circuit card of claim 4, wherein the shielding piece is comprised of steel.

6. The circuit card of claim 4, wherein the shielding piece ring further defines a set of aperture holes suitable for receiving a corresponding set of fasteners, wherein the fasteners maintain the heat sink in close proximity to the module.

7. The circuit card of claim 1, wherein the heatsink comprises a conductive slab from which a plurality of conductive fins extend substantially perpendicularly.

8. A heatsink grounding mechanism, comprising:
a grounding piece, wherein the grounding piece includes a substantially rectangular and conductive grounding piece ring defining an aperture dimensioned for receiving an integrated circuit module, and wherein the grounding piece includes a set of semi-rigid conductive spring arms extending away from the grounding piece ring at an angle of less than approximately 60°, and further wherein the springs arms are positioned and oriented to terminate in contact with grounding pads on a printed circuit board when the module is received within the aperture and attached to the printed circuit board and a heatsink is in close proximity to the module package, wherein the force of the spring arms against the printed circuit board maintains the shielding piece ring in electrical contact with the heat sink and the termination points of the spring arms in electrical contact with the grounding plates.

9. The heatsink grounding mechanism of claim 8, wherein the conductive material comprises steel.

10. The heatsink grounding mechanism of claim 8, wherein the spring arms are integrally formed with the grounding piece ring.

11. The heatsink grounding mechanism of claim 8, wherein the grounding piece ring further defines a set of fastener holes suitable for receiving a corresponding set of fastener, wherein the grounding piece fastener holes align with corresponding holes in the heatsink.

12. The heatsink grounding mechanism of claim 8, further comprising a shielding piece comprising a substantially rectangular shielding piece ring defining a shielding piece aperture dimensioned for receiving the integrated circuit module, wherein the shielding piece further includes a set of shielding piece walls extending substantially perpendicularly from the shielding piece ring, wherein the walls are positioned to substantially enclose the spring arms of the grounding piece when the shielding piece ring is positioned intermediate between the grounding piece ring and the heatsink.

13. The heatsink grounding mechanism of claim 12, wherein the shielding piece is comprised of steel.

14. The heatsink grounding mechanism of claim 12, wherein the shielding piece further defines a set of aperture holes suitable for receiving a corresponding set of fasteners, wherein the fasteners maintain the heat sink in close proximity to the module.

15. A computer system comprising:
a chassis;
a power supply housed within the chassis; and
a circuit card received within the chassis of the computer system and powered by the power supply, wherein the circuit card includes:
a printed circuit board;
an integrated circuit module attached to a first face of the printed circuit board;
a heatsink in close proximity with a package of the module; and
a grounding piece, wherein the grounding piece includes a substantially rectangular and conductive grounding piece ring defining an aperture dimensioned for receiving the integrated circuit module, and wherein the grounding piece includes a set of semi-rigid conductive spring arms extending away from the grounding piece ring at an angle of less than approximately 60° and positioned and oriented wherein termination points of the arms contact grounding pads on the printed circuit board, wherein the force of the spring arms against the printed circuit board maintains the grounding piece ring in electrical contact with the heat sink and the termination points of the spring arms in electrical contact with the grounding plates.

16. The system of claim 15, wherein the spring arms are integrally formed with the grounding piece ring.

17. The system of claim 15, wherein the grounding piece ring further defines a set of fastener holes suitable for receiving a corresponding set of fastener, wherein the grounding piece fastener holes align with corresponding holes in the heatsink.

18. The system of claim 15, further comprising a shielding piece comprising a substantially rectangular shielding piece ring defining a shielding piece aperture dimensioned for receiving the integrated circuit module, wherein the shielding piece further includes a set of shielding piece walls extending substantially perpendicularly from the shielding piece ring, wherein the walls are positioned to substantially enclose the spring arms of the grounding piece when the shielding piece ring is positioned intermediate between the grounding piece ring and the heatsink.

19. The system of claim 18, wherein the shielding piece ring further defines a set of aperture holes suitable for receiving a corresponding set of fasteners, wherein the fasteners maintain the heat sink in close proximity to the module.

20. The system of claim 18, wherein the heatsink comprises a conductive slab from which a plurality of conductive fins extend substantially perpendicularly.

* * * * *